United States Patent [19]

Kohlmeier et al.

[11] Patent Number: 4,998,250

[45] Date of Patent: Mar. 5, 1991

[54] METHOD AND APPARATUS FOR DETERMINING AN INTERNAL STATE OF AN ELECTRONIC COMPONENT

[75] Inventors: F. David Kohlmeier; Kellee Crisafulli, both of Redmond; Stephen A. Kaufer, Seattle; John P. Rostykus, Redmond; Douglas K. Yip, Bellevue, all of Wash.

[73] Assignee: Data I/O Corporation, Redmond, Wash.

[21] Appl. No.: 241,617

[22] Filed: Sep. 8, 1988

[51] Int. Cl.$^5$ .............................................. G06F 11/00
[52] U.S. Cl. .................................. 371/15.1; 371/22.6
[58] Field of Search ........................ 371/15.1, 18, 16.5, 371/22.1, 22.2, 22.6, 25.1, 8.1, 11.1, 11.3, 68.1; 364/187; 324/73 R, 73 AT

[56] References Cited

U.S. PATENT DOCUMENTS

| | | | |
|---|---|---|---|
| 4,183,459 | 1/1980 | Donn | 371/25.1 X |
| 4,216,539 | 8/1980 | Raymond | 371/22.6 |
| 4,271,515 | 6/1981 | Axtell | 371/68.1 X |
| 4,437,154 | 3/1984 | Eisele | 364/187 |
| 4,623,883 | 11/1986 | Konen | 364/187 X |
| 4,654,850 | 3/1987 | Rodrigues | 371/25.1 |
| 4,788,683 | 11/1988 | Hester | 371/16.2 X |
| 4,791,357 | 12/1988 | Hyduke | 371/25.1 X |

Primary Examiner—Jerry Smith
Assistant Examiner—Robert W. Beausoliel
Attorney, Agent, or Firm—Seed and Berry

[57] ABSTRACT

A method and apparatus for observing an internal state of an electronic component in an electronic system comprising one or more electronic components. The apparatus consists of an electronic switch, a second electronic component, and a control circuit. The electronic switch can be operated in a first mode or a second mode. A first set of terminals on the electronic switch is connectable, in the first mode, to the first component to intercept both the signals being transmitted to the first component by the electronic system and the signals being transmitted by the first component to the electronic system. The electronic switch produces output signals in response to the intercepted signals and transmits them to the second electronic component. The control circuit causes the electronic switch to switch from the first mode to the second mode. In the second mode, the electronic switch can transmit test signals from the control circuit to the second component. The electronic switch can also transmit signals representative of the response of the second component to a third set of switchable terminals. If desired, the representative signals can be stored in a digital memory that is connected to the third set of switchable terminals.

49 Claims, 4 Drawing Sheets

METHOD AND APPARATUS FOR DETERMINING AN INTERNAL STATE OF AN ELECTRONIC COMPONENT

TECHNICAL FIELD

This invention relates to a method and apparatus for use in analyzing an electronic component, and more particularly, to a method and apparatus for determining an internal state of an electronic component.

BACKGROUND ART

The process of developing a system to have a specified performance generally consists of four phases. The first phase is to specify the system at a high level. The next phase is to partition and subsequently specify the system's subsystems. A further phase is to perform detailed analysis of each of the subsystems. The last phase is to build a prototype of the system (or possibly only a subsystem) to verify the system design for correct operation. This final phase is also known as the "debug and integration" phase. While the prototype may be a software simulation of the system, most design teams rely on physical prototypes for full evaluation.

The debug and integration of digital systems requires a methodical approach to problem isolation, problem analysis, and determination of the cause of the problem. Once a deviation from the specification occurs, the engineer begins the "debug" process, which is the analysis of current system operation to identify the cause of the deviation. Key to productive problem-solving during debug and integration is the ability to observe the system, and to observe it with enough detail to allow for easy analysis. It is important to recognize that during the debug process the number of possible causes grows exponentially as the ease of observing the system diminishes, making the analysis more difficult.

With current digital designs, wiring errors, logic errors and noise-induced errors can be observed with a logic probe, analyzer, or oscilloscope. As the designer analyses the data and traverses the potential problem paths to find the source of a problem, he or she can move probes from package to package with little or no difficulty. However, the designer is dealing with the devices that comprise the system or subsystem at the same level during the debug phase as during the system or subsystem specification phase. When a circuit problem is observed at the system level and it is impossible to trace a potential problem path, the designer must infer the operation of the circuit to isolate the problem's cause. Also, if a designer cannot observe the circuit in question with sufficient detail, he is forced to resort to inference.

Tools that are used during debug and integration allow the engineer to observe events as they occur in the system. Logic analyzers, oscilloscopes and emulators are some of the instruments that currently address this need.

In the last several years many new technologies have emerged, reducing the ability of the currently available tools to observe the system operation. As this has occurred, new tools were brought to market to address the need. For example, when advent of the microprocessor presented wide data and address paths that could not be efficiently observed by an oscilloscope, the logic analyzer market was born. The microprocessor also presented the problem of errors occurring only during specific sections of a program. The sequential state trigger was added to most logic analyzers to detect these errors. As another example, gate arrays, with their high level of circuit integration on a single piece of silicon, have forced designers to simulate the circuit operation in software, thus creating the simulator market.

The digital system designer is now faced with a new technology called "Logic Cell Arrays" (LCA). An example is the XILINX chip, produced by Xilinx, Inc., of San Jose, Ca. LCA technology might more appropriately be called "programmable gate arrays" (PGA) because its architecture resembles that of the traditional gate array in many ways. The LCA is RAM-based and is configured with state RAM control bits. An important aspect of LCA technology is that an LCA offers a gate-array-like architecture that is reprogrammable in seconds. LCA technology will affect the debug and integration phase because users can integrate their designs into the device, but cannot observe the operation of the resulting circuit at low levels.

An electronic component is typically connected to other electronic circuitry through terminals which allow the transfer of signals to and from the electronic component. When the component contains digital circuitry, the signals produced by the electronic component result from its then-current internal state. The internal state, in turn, is affected by the present internal state and any signals which may be communicated to the component through its terminals.

In analyzing or testing such an electronic component, it is frequently useful to determine its internal state at a particular point in its operation and to follow the component's internal state as it changes in response to the receipt of external signals. Analysis also requires an observation tool to see the internal states. Some electronic components have been designed to facilitate the readout of their internal states. IBM, for example, has developed an architecture which allows signals indicative of a component's internal state to be read out as a string of bits that are produced by internal shift registers.

While such architectures facilitate the readout of an electronic component's internal state, the readout of the internal state information generally takes much longer than the rate at which the component normally changes states. Therefore, the component must be placed in a circuit that is substantially slower than the component's design speed. Accordingly, the component may be operating under conditions which are different from its operational conditions. This is undesirable since it can give false indications of the component's performance at operational speeds.

For example, in the past, integrated circuit tests have allowed observation and analysis of the internal states of an electronic component by starting it from a known state, imposing a prescribed sequence of external signals, and reading the state of the component when the sequence of signals reaches a predetermined point. See, for example, IBM Technical Disclosure Bulletin, "Module Test with Computer Simulator and Random Pattern Generator," H. Rossero; vol. 25, no. Oct. 5, 1982. After the internal state has been read out, the component can then be slowly stepped through a further sequence of external signals, with the component's internal state being determined at each point in the sequence.

In some schemes, it has been proposed to test an electronic component by comparing signals on its terminals with the signals on the terminals of a reference component which is known to operate correctly. See, for example, IBM Technical Disclosure Bulletin, "Test Program Generator," G. R. Giedd, M. H. Perkins, and J. Squarzini, vol. 13, no. 56, Oct. 1970; U.S. Pat. No. 4,654,850, issued Mar. 31, 1987; to Rodrigues et al, and U.S. Pat. No. 3,821,645, issued June 28, 1974, to Vinsani. In these analysis schemes, the device under test is operated in parallel with the reference component until a critical point in the component's operation is reached. From this point, the signals on the external terminals of the two components are compared to assure that the two components are operating identically. Obviously, however, this scheme is undesirable since it does not observe and analyze the internal states of the component. In addition, such a scheme is not relevant in design verification, since there is no good reference circuit available until the design has been verified.

It has been proposed that, when simulating a system in software for analysis purposes, where models for specific components are unavailable, the actual component be used for the model. See, U.S. Pat. Nos. 4,590,581 and 4,635,218, issued to Widdoes on Mar. 22, 1984 and May 20, 1986, respectively, and "Hardware Modeling," by L. C. Widdoes, VLSI Systems Design, Volume IX, No. 7, July 1988. The response of the component is thus determined by imposing a sequence of external signals and reading the state of the component at the end of the sequence. The state of the component is then passed on to the software simulation for its use. However, with this proposed scheme, the sequence of signals originates from the simulation, not from the actual system.

DISCLOSURE OF THE INVENTION

It is an object of the present invention to provide a method and apparatus for analyzing the response of an electronic component without the need for a reference component containing circuitry which is known to operate properly.

It is another object of the present invention to provide a method and apparatus for analyzing the internal state of an electronic component without the need for a reference component containing circuitry which is known to operate properly.

It is a further object of the present invention to provide a method and apparatus which can cause both an electronic component in a system and a second component to be placed in desired internal states.

It is a still further object of the present invention to provide a method and apparatus which can cause predetermined signals to be imposed on selectable terminals of both an electronic component in an electronic system and a second component.

It is yet another object of the present invention to provide a method and apparatus for observing an internal state or a sequence of internal states of a first component prior to a predetermined event by causing the current internal state of a second component to lag the current internal state of a first component in an electronic system by a known amount of time.

It is an additional object of the present invention to provide a method and apparatus which can cause signals representing a sequence of internal states of an electronic component in an electronic system to be stored in a memory device.

A still further object of the present invention is to provide a method and apparatus for causing signals representing a sequence of internal states of an electronic component in an electronic system to be used by a simulation program operating in a host computer.

Yet another object of the present invention is to provide a method and apparatus for operating a first component in an electronic system in parallel or concurrently with a second component until the occurence of a predetermined event.

A further object of the present invention is to provide a method and apparatus for operating a first component in an electronic system in parallel or concurrently with a second component until a predetermined time.

According to one aspect, the invention is an apparatus for determining a sequence of internal states representing a response of a first electronic component in an electronic system comprising one or more electronic components. The first electronic component has one or more first input terminals for communication of signals with the electronic system. The apparatus comprises electronic switch means for controllably switching between a first mode and a second mode. The electronic switch means comprises first and second sets of switchable terminals. The first set of switchable terminals is connected to the first input terminals.

The electronic switch means is adapted to permit communication of signals between the first set of switchable terminals and the second set of switchable terminals when the electronic switch means is in the first mode. It is further adapted to prevent communication of signals between the first set of switchable terminals and the second set of switchable terminals when the electronic switch means is in the second mode.

The apparatus further comprises a second electronic component having one or more second input terminals connected to the second set of switchable terminals. The second electronic component operates in parallel with and has a response that is substantially representative of the response of the first electronic component when the electronic switch means is in the first mode. The second electronic component is disconnected from the first electronic component when the electronic switch means is in the second mode. The second electronic component further maintains its internal state at the time the electronic switch means is switched from the first mode to the second mode.

The apparatus also comprises a control circuit means for switching the electronic switch means between the first mode and the second mode.

In a further aspect the apparatus of the invention comprises a third set of switchable terminals. The third set of switchable terminals are connected to the second set of switchable terminals when the electronic switch means is in a third mode. The signals representing the response of the second component can thereby be communicated between the second signal input terminals and the third set of switchable terminals.

In another aspect, the invention is a method for determining an internal state of a first electronic component at the time of occurrence of a predetermined event, where the first electronic component forms part of an electronic system comprising one or more electronic components and having one or more signal input terminals for receiving signals from the electronic system. The method comprises three steps. One step is: (a) connecting electronic switch means to the electronic system to controllably switch between a first mode and a second mode, the electronic switch means transmitting the signals from a first set of switchable terminals to a second set of switchable terminals when the electronic switch means is in the first mode and isolating the second set of terminals from the signals when the electronic switch means is in the second mode. The method also comprises the steps of (b) connecting one or more signal input terminals of a second electronic component to the second set of terminals of the electronic switch means, (c) causing the electronic switch means to enter the first mode and (d) operating the first electronic component and the second electronic component concurrently. Further, the method comprises the steps of (e) causing the electronic switch means to enter the second mode and (f) reading the signals representing the internal state of the second component from the second component to the electronic switch means.

In a further aspect, the method of the invention includes the steps of: (g) causing the second component to change to a second internal state from the first internal state; and (h) reading the signals representing the internal state of the second component from the second component to the electronic switch means.

BEST MODES FOR CARRYING OUT THE INVENTION

Figure 1:
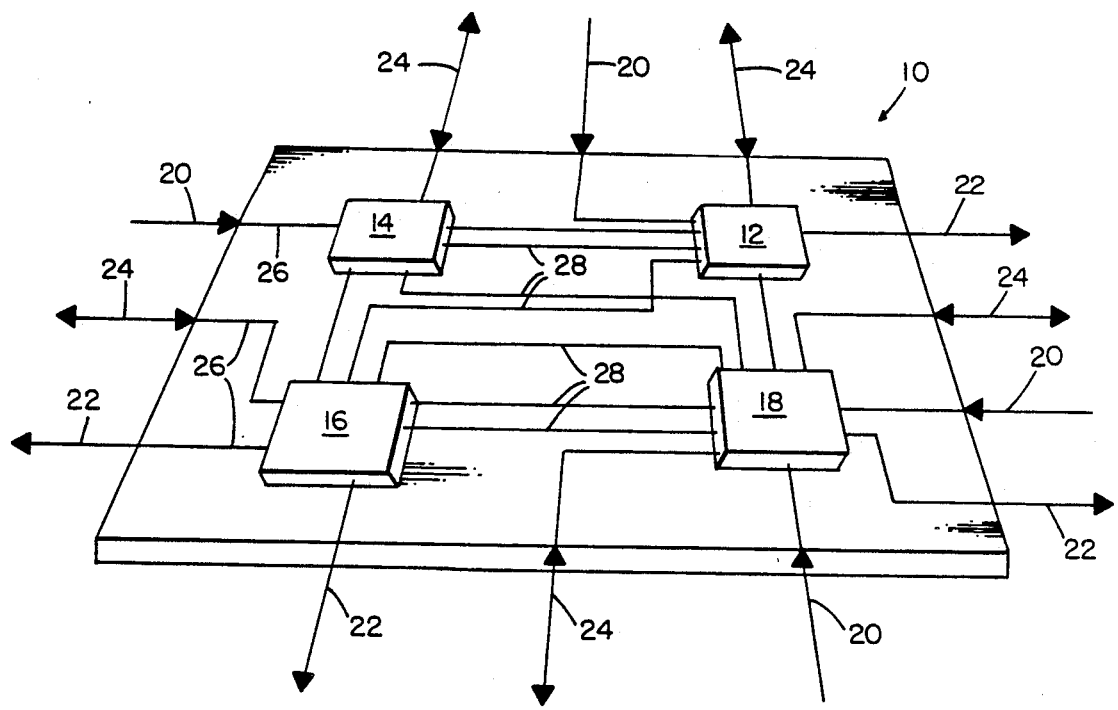
FIG. 1 is a schematic diagram of an electronic system to be tested, comprising one or more electronic components.

Referring to FIG. 1, an electronic system 10 includes one or more electronic components 12, 14, 16, and 18. As shown schematically, the electronic system 10 generally receives external signals through some input signal lines 20, transmits output signals through output signal lines 22, and both receives and transmits still other input and output signals through bidirectional signal lines 24. Through internal interconnections not shown in FIG. 1, the signals received and transmitted on signal lines 20, 22, and 24 are communicated from and to appropriate electronic components 12, 14, 16, and 18 along internal signal lines 26. Some of the electronic components 12, 14, 16 and 18 are interconnected through internal signal lines 28.

Each of the electronic components 12, 14, 16, and 18 can be described at any moment by its internal state. In that case that an electronic component contains digital circuitry, for example, binary circuitry, the internal state of the digital circuitry can be described by the values of the signals which the digital circuitry contains. If the digital circuitry is binary, its internal state at any particular time can be described in terms of the bit pattern which the circuitry contains at that time.

An electronic system, such as system 10, can be caused to change internal state by the effect of external signals received through one or more signal lines 20 or 24, through the effect of its current internal state, or, more typically, through the effect of both external signals and its internal state. For example, if the system 10 contains a microprocessor connected to a digital memory, the microprocessor could receive signals from both external sources and the memory (possibly in response to signals produced by the microprocessor itself) which would cause the microprocessor to change the data contained in its internal registers from one set of values to another set of values. Similarly, the memory component could be considered to have a state which changes as a result of signals received from the microprocessor and possibly other, external, signals.

An electronic component such as first component 12 is deterministic. In other words, if the system 10, of which first component 12 were a part, were to be started from the same internal state and to receive the same external signals, the first component 12 would pass through the same sequence of internal states. Throughout this detailed description, a response of a component will be understood to be a sequence of internal states the component passes through. Knowledge of the response of a component, such as first component 12, passes through is useful for a number of purposes. One important purpose is to assure a designer who is using the component in the design of a system that the component is performing in the expected way to achieve the expected result. By means of detailed knowledge or simulation of the response of a component to a known set of stimulus signals, the designer can establish whether the component is performing as expected. This is useful both in developing an electronic system and in later analyzing the system.

Figure 2:
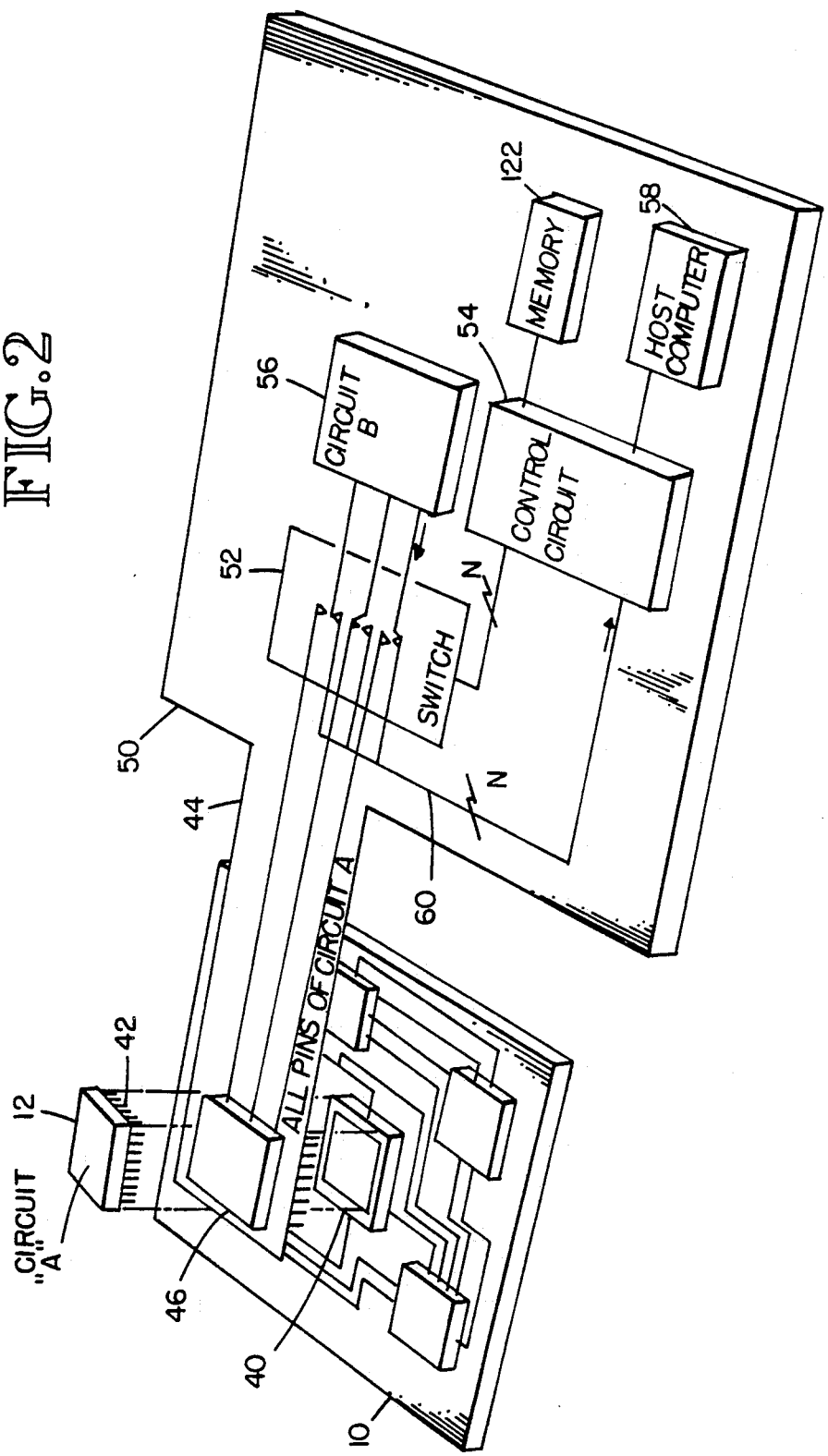
FIG. 2 is a block diagram depicting the apparatus of the present invention, shown in conjunction with the electronic system of FIG. 1.

FIG. 2 is a schematic diagram of the apparatus of the present invention being used in conjunction with the electronic system 10 of FIG. 1. The electronic system 10 includes a first electronic component 12, containing circuitry, such as digital circuit A. The first component 12 can conveniently be removably interconnected to the system 10 through a conventional socket 40 which is designed to make electrical contact with each of the terminals 42 through which first component 12 receives and transmits its signals. Alternatively, the circuit 12 can be fixedly connected to the system 10, for example, by soldering the terminals to appropriate signal lines in the system 10. As shown in FIG. 2, one technique for reading out the signals received and transmitted by the first component 12 (when the first component 12 is removable) is to remove the first component 12 from its socket 40 and place a connector 44 into socket 40. The connector 44, which is adapted to connect into the socket 40, contains another socket 46 into which the first component 12 can be connected. Socket 46 will supply first component 12 with the same signals it would receive if connector 44 had not been placed between socket 40 and first component 12. If the first component 12 is fixedly placed in the system 10, the signals it receives and transmits can be intercepted through other terminals or connectors built into the system 10 for that express purpose.

Regardless of how the signals received and transmitted by first component 12 are intercepted, some or all of them can be transmitted along connector 44 to the inventive apparatus 50, which includes the connector 44 and socket 46. At least some of the signals on the terminals 42 are transmitted to a controllable electronic switch circuit 52, shown symbolically as comprising a double pole-double throw switch, although it could take any of a variety of forms. The electronic switch circuit 52 can be controlled by a control circuit 54 which can take a number of forms. For example, the control circuit 54 can be either a dedicated subcircuit designed specifically for the purpose of controlling the electronic switch circuit 52 or a conventional personal computer that has been programmed specifically for that purpose. The required program will be conventional and well understood by those skilled in the art.

The electronic switch 52 has at least two modes. One mode is to communicate signals between the connector 44 and a second electronic component 56. Another mode is to prevent communication between the connector 44 and the second electronic component 56. The electronic switch 52 can also have other modes. In a third mode, the control circuit 54 can cause predetermined signals to be imposed in selected terminals of the first and second electronic components 12 and 56. In a fourth mode, the electronic circuit 54 can cause memories associated with each of the first and second electronic components 12 and 56 to be loaded with signals representing initial internal states. Some of the signals intercepted by the connector 44 can be transmitted to the second component 56, and the test circuit 58 and the second component 56 can communicate through only some of the signal lines 60. Depending upon the application of the inventive apparatus 50, the control circuit can cause the electronic switch 52 to change from the first mode to the second mode, or to some other mode, to accomplish any of the aforesaid desired test purposes, or some other purpose which will be obvious to those skilled in the art.

The apparatus 50 is generally intended to monitor the operation of the first component 12 until some predetermined event, such as the receipt of a prescribed sequence of signals, has occurred. Upon the occurrence of the predetermined event, the control circuit 54 causes the electronic switch 52 to change from its first mode to its second mode (or possibly some other mode). Because the control circuit 54 has caused the electronic switch to change modes upon the receipt of a prescribed event, the control circuit 54 has allowed a known sequence of signals to be transmitted to the second component 56. While it is typically of interest for the first component 12 and the second component 56 to be in the same internal state at the same time, it can also be of interest for the internal state of the second component 56 to lag the internal state of the first component 12 by a known amount of time. Operating the two components 12 and 56 in the same state simultaneously will be referred to as concurrent operation, while operating the two components 12 and 56 with the second component 56 lagging the first component 12 by a known amount of time will be referred to as parallel operation. Circuitry to cause parallel operation of the first and second components 12 and 56 will be described in detail subsequently.

As described in the foregoing, the internal state of the second component 56 is knowable. It can become known after the electronic switch 52 is caused to change mode by the control circuit 54 by subjecting the second component 56 to a controlled sequence of signals which may be independent of the signals produced by the system 10. This controlled sequence of signals can be used to determine the internal state of the second component 56 by the injection of appropriate interrogation signals produced by the test circuit 58.

The inventive apparatus can be used to determine the detailed behavior of a particular electronic component by replacing components 12 and 56 with copies of components which perform substantially identically. By this arrangement it is possible to cause the first and second components 12 and 56 to be driven to the same internal state by the system 10, and then to cause the electronic switch to change from the first mode so that the second component 56 can be given more detailed tests by the test circuit 58. This is particularly advantageous when the component in question, of which substantially identical copies have been placed in the locations of components 12 and 56, is performing in an unexpected or misunderstood manner. The state of the second component 56 can then be held at its present state for detailed analysis while the system 10, including first component 12, continues to operate in its normal fashion.

Figure 3:
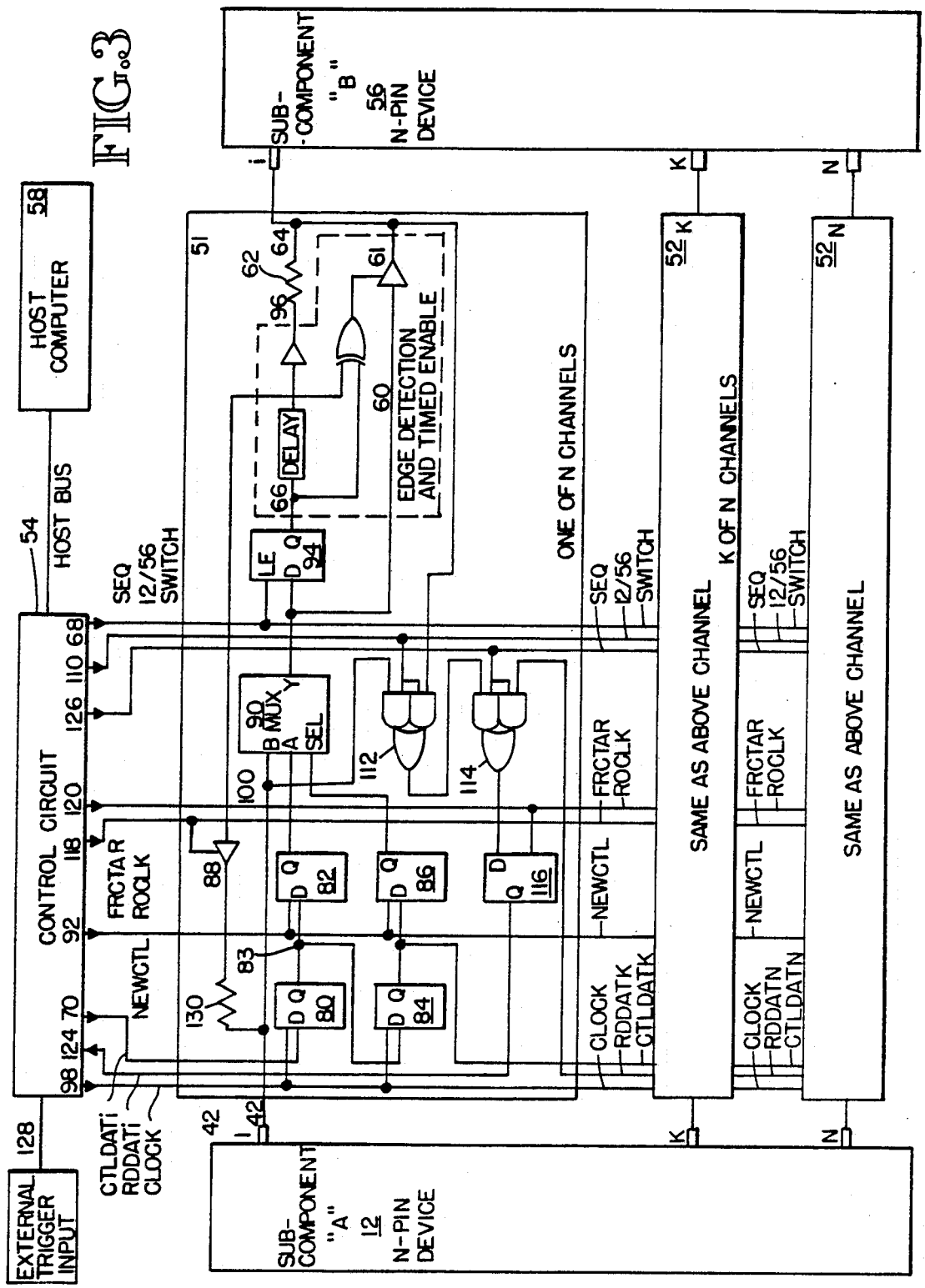
FIG. 3 is a schematic diagram of a first embodiment of an interconnection between the electronic component whose internal state is to be determined and the apparatus for determining the internal state.

The apparatus of the present invention can be interconnected to the first and second components 12 and 56 through a variety of circuits. For example, FIG. 3 shows the schematic representation of an implementation of the electronic switch 52 with a detailed schematic diagram provided for one of the N channels, which may be identical. Circuits for the individual channels will be designated by subscripted reference numerals. For example, the kth component of the electronic switch 52 is designated by $52_k$. It is possible that the signals intercepted by the connector 44 can be combined through logic circuitry included in the electronic switch 52 or the second component 56 to produce desired signals which affect the internal state of the second component 56 in some known manner. More typically, however, the intercepted signals will be sent directly to the second component 56. Even if the intercepted signals are sent to the electronic switch 52, the electronic switch can cause certain transformations to occur.

The apparatus 50 has two primary modes of operation. In the first mode, the electronic switch 52 will pass the signals produced by the system 10 for input to the first component 12 through to the second component 56 until a command to freeze is received. In the second mode, the second component 56 will receive signals loaded from the host computer into the electronic switch 52.

In the first mode, the signals produced by the system 10 for input to the first component 12 are also connected to the input to a multiplexer 90. This allows either the signals produced by the system 10 or a signal produced by a storage element 82 (which can be a D flip/flop contained on a programmed XILINX model 2000 device, or equivalent circuit) to pass to the second component 56 under control of the mode select storage element 86.

Freezing Second Component

When the electronic switch 52 is operating in the first mode (passing the signals produced by the system 10 for input to the first component 12 through to the second component 56), the control circuit 54 can assert the switch signal 68, causing the storage element 94 (which can be a latch in a programmed XILINX 2000 device, or an equivalent latch circuit) in each channel to freeze the state of input signals 64 to second component 56. At this point, the internal state of the second component 56 is static and knowable. The control circuit 54 can now change the mode of operation of the electronic switch 52 to allow a conventional host computer 58 (via storage element 82) to stimulate the second component 56 or to deassert the switch signal 68 and continue in the first mode of passing signals on node 100 through to node 64. The conventional host computer 58 can be programmed according to conventional techniques well understood by those skilled in the art.

Switching Modes

In order to cause the electronic switch 52 to switch from the transparent "passthrough" mode to the second "analyze" mode (where the source of the data for storage element 94 and, therefore, for second component 56, is the host computer 58 via storage element 82), it is required that the control circuit 54:1) shift a new control word into the serial command register (consisting of storage elements 80 and 84 in each of the N channels) and assert the new control ("newctl") signal 92 transferring the values for storage element 82 (data from host computer 58) and storage element 86 (mode control) from serial command register storage elements 80 and 84, respectively. Those skilled in the art will recognize that the storage element 94 does not have to be frozen (latched) for a mode change to occur.

Loading a New Command

In order to load a new command, the host computer 58 issues commands to the control circuit 54, changing the modes on some or all channels and the values to apply to second component 56 for those channels changing to the analyze mode. This is done by serially clocking the new values for each channel of the electronic switch 52 into the serial command register. Control circuit 54 places the new command data on the control data ("ctldat1") line 70 and issues a clock ("clock") signal 98. This continues until all channels have received updated values in storage elements 80 and 84. At that time, the control circuit 54 asserts the newctl signals 92 and each individual channel of the electronic switch updates the new values into storage element $82_x$ and $84_x$ (where x is from 1 to N). The control circuitry can now deassert the switch signal 68 (if it has not already) from the storage element 94 passing the signal from storage element 82 to the second component 56.

Passthrough Mode Operation

The electronic switch 52 is placed in the first "passthrough" mode and both components 12 and 56 are initialized to an identical state either through reset or some other means (discussed later in the description). Both components 12 and 56 are now receiving identical stimulus and are released to run in parallel or concurrently. The signals to the first component 12 are connected to an input to the multiplexer 90 and the edge detection and timed enable circuit 60. Since the signal line on second component 56 can be bi-directional, the output signal 96 produced by the edge detection and timed enable circuit 60 must be current limited by resistor 62 to avoid contention with the output buffer of second component 56. However, in order to produce minimum skew among the signals on separate channels, the integrity of the signal's rise time must be maintained. In order to drive signal node 64 to an active logic level rapidly, a second non-current limited circuit 61 is enabled for a short period of time whenever a change in state of signal node 66 is detected. Circuit 61 drives node 64 to the new active level and then enters a "3-state" condition while the output of the storage element 94 will maintain the correct logic level on node 64 if node 64 is not an output from second component 56.

The electronic switch can now be commanded to switch (see above) at any time.

Feedback of the Terminals of First or Second Components

The ability to read-back the state of nodes 64 or 100 is also included in the electronic switch 52. Control circuit 54 is instructed by the host computer 58 to readback from either the terminals of the first component 12 or the terminals of the second component 56. The control circuitry asserts the "12/56" control line 110 which is monitored by all channels of the electronic switch 52, causing multiplexer 112 to pass either the signals node 64 or signals node 100 through to the serial readback shift register 116 by passing through the multiplexer 114. The control circuit 54 will then clock the readback shift register 116 by asserting the read clock ("rdclk") signal 120, causing data from either signal node 64 or signal node 100 from all the channels of the electronic switch 52 to be recorded in the readback shift register 116. The control circuit 54 will then change the state of the sequence ("seq") line 126 to cause the multiplexer 114 to pass data from the (k+1)st channel readback shift register 116 instead of the output of multiplexer $112_k$ to the input of the serial readback shift register $116_k$. This creates a large shift register so that control circuit 54 can now shift the contents of all electronic switch channels $52_1$ through $52_N$ by clocking signal rdclk 120 N times and recording N bits from read data ("rddat[k+1]") line 124. The control circuit then transmits this data into memory 122 or host computer 58.

Forcing Signal Nodes 64 and/or 100

Also included in the electronic switch 52 is the ability to force the signal terminals on the first component 12. This ability can be used to stimulate the first component 12 or the system 10. When the electronic switch 52 is in the second mode, the data from storage element 82 is passed through to the second component 56 and can be forced to the signal 100 on first component 12 when the force target ("frctar") signal 118 is asserted by control circuit 54 to turn on buffer $88_k$. Buffer $88_k$ then asserts the signal to the signal terminal of first component 12 (and therefore the system 10 through connector 44) through the current limiting resistor 130. In order to maintain valid logic levels on the signal terminal of first component 12, it may also be necessary to disable the signals which the system 10 would otherwise send to the terminal 42 of the first component 12. This ability to force a single logic level or a sequence of logic levels to the first or second components 12 or 56, respectively, can be used to initialize internal states, extract internal states, or other component specific sequences required for analysis, observation, or initialization.

The initial implementation of the electronic switch 52 has been designed in a XILINX (TM) Programmable Gate Array. The first supported components (12 and 56) are XILINX Programmable Gate Arrays. To those skilled in the art, it is apparent that special electronic switch channels can be designed to support special function terminals for either first component 12 or second component 56. By allowing these special channels, this apparatus can be used on any component that has hidden internal states, be it, for example, a gate array, standard cell, or custom device, provided that there exists a method by which the internal state of second component 56 can be extracted.

For example, as shown in FIG. 3, one of the signals produced by the system 10 for input to the first component 12 can be subjected to a switch and hold circuit. This circuit can allow either the signal produced by the system 10 or a signal produced by the test circuit 58 to pass to the second component 56. Under the control of the control circuit 54, this can allow particular signals produced by the system 10 to be tested with respect to the second component 56. The electronic means for switching, shown in FIG. 3, can switch between two modes. These modes are determined by the storage element 86. One mode is a transparent "passthrough" mode and the other is a "hold last state" mode. The storage element 86 controls the multiplexer 90 to either use the signal connected to the first component 12 as its source, or to use the data in storage element 82. Both storage elements 82 and 86 are sampled from the serial control shift chain consisting of elements 80 and 84 upon the assertion of signal 92.

The electronic switch 52, including switch and hold circuit $52_1$, is placed in a mode to cause second component 56 to operate in parallel with first component 12 until a point in time when the stimulus which is connected to both first component 12 and second component 56 is disconnected from second component 56. When the electronic switching means 52 is in a first, or "passthrough" mode, the signal to the first component 12 is monitored through multiplexer 90 by a passthrough latch 94 and the edge detection and timed enable circuit 60. Since the signal line on second component 56 can be bidirectional, the output signal 96 produced by the edge detection and timed enable circuit 60 must be current limited by resistor 62 to avoid contention with the output buffer of second component 56 if that signal is being driven by second component 56.

However, in order to produce minimum skew among the signals on separate channels, the integrity of the signal risetime must be maintained. In order to drive signal node 64 to an active logic level rapidly, a second noncurrent limited circuit 60 is enabled for a short period of time whenever a change in state of signal node 66 is detected. Circuit 60 drives node 64 to the new active level and then enters a "3-state" condition while the output of the passthrough latch 58 will maintain the correct logic level on node 64 if node 64 is an input.

When a command is asserted on switch line 68 to cause the electronic switch means 52 to switch to the second mode, the "switch" signal will be asserted on and therefore recognized by the passthrough latch 94. Passthrough latch 94 will hold the then-current state of signal node 66 on node 64. After passthrough latch 94 and non-current limited circuit 60 have switched modes of operation, it is then possible to present data to second component 56 from storage element 82 through signal line 70 to allow a predetermined sequence of signal levels to be passed to second component 56.

Figure 4:
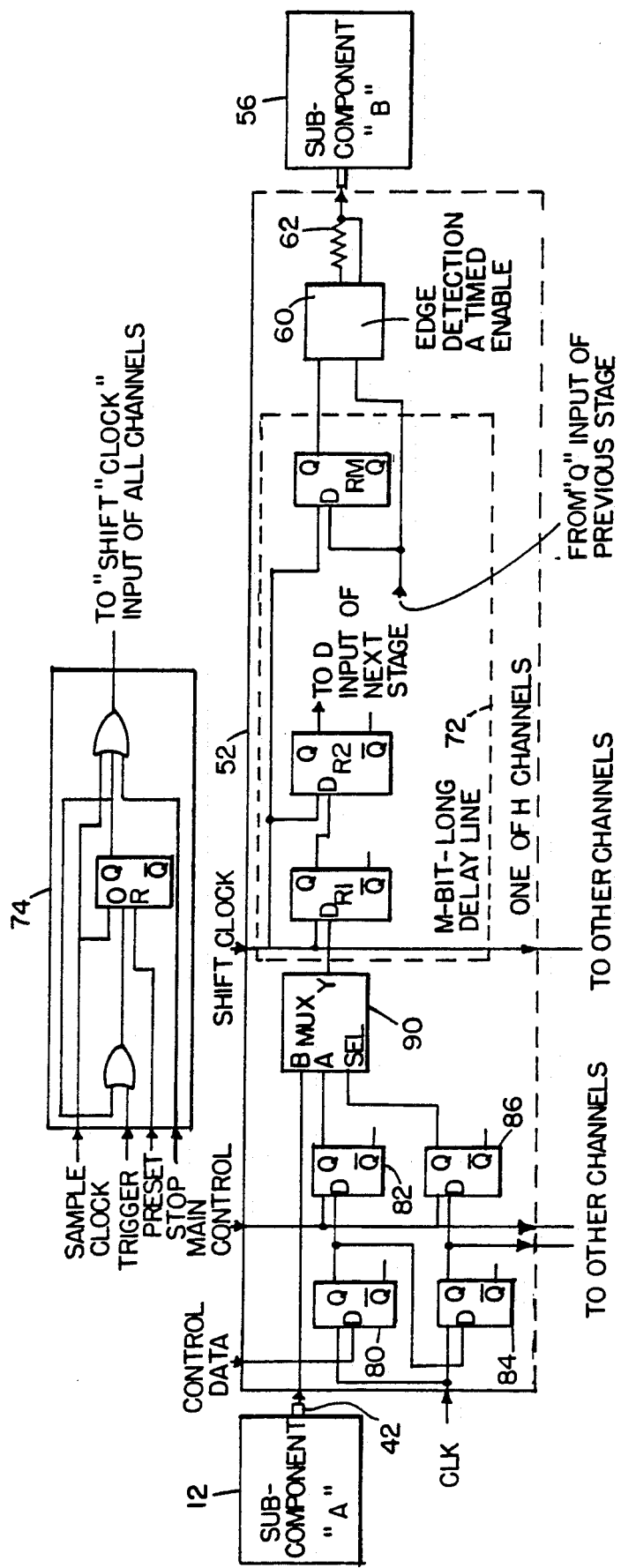
FIG. 4 is a schematic diagram of a second embodiment of an interconnection between the electronic component whose internal state is to be determined and the apparatus for determining the internal state.

Similarly, selected signals produced by the system 10 can be delayed by the electronic switch 52 to provide pretrigger information which can be used to test the second component 56. Pretrigger information is that information which relates to the internal states or response of a component that occurs some period of time before the electronic switch means switches from the first mode to the second mode or the occurrence of a predetermined event. Such a predetermined event is the attainment of a particular internal state or configuration of internal registers. The block diagram of FIG. 4 illustrates an apparatus that will allow second component 56 to run in parallel with first component 12, but delayed in time, allowing for extraction of pretrigger information from second subcomponent 56. The major difference between the block diagram of FIG. 4 and the circuit of FIG. 3 is that the passthrough storage element 58 of FIG. 3 would be replaced by a first-in/first-out (FIFO) queue of storage elements. The elements can be digital or analog storage elements. The FIFO queue could then be commanded to "hold last state" and second component 56 would be held at a state prior to an event (referred to as a trigger). This is illustrated by the table below:

| STIMULUS | STATE OF FIRST COMPONENT | CONTENT OF FIFO | STATE OF SECOND COMPONENT |
|---|---|---|---|
| Reset | 0 | —,—,—,reset | |
| a | 0 | —,—,reset,a | |
| b | 0 | —,reset,a,b | |
| c | 1 | reset,a,b,c | 0 |
| d | 2 | a,b,c,d | 0 |
| e | 3 | b,c,d,e | 0 |
| f | 0 | c,d,e,f | 1 |
| g | 2 | d,e,f,g | 2 |
| h | 4 | e,f,g,h | 3 |
| i | 6 Trigger | f,g,h,i | 0 |
| j | 6 | f,g,h,i | 0 |
| k | 8 | f,g,h,i | 0 |
| | | f,g,h,i | 0 |
| | | f,g,h,i | 0 |
| x | x step1 | g,h,i,— | 2 |
| x | x step 2 | h,i,—,— | 4 |

Note that the stimulus g,h,i which are required to advance second component 56 to the trigger value of "4" still queued up in the FIFO circuit 72. FIFO circuit 72 can be of any convenient length. This stimulus can be applied to second component 56 to pretrigger state information from second component 56. Single step control of the FIFO circuit would allow stimulus that was in the queue after the command to trigger was received, to be applied to second component 56. If the internal pretrigger history of the states of second component 56 was extracted after each step, a trace of the states of second component 56 (and therefore first component 12) is made available.

Another configuration of the electronic switch 52 can be used to impose identical signals originating with the test circuit 58 on corresponding terminals of the first and second components 12 and 56. To cause the signals produced by the test circuit 58 to be sent through the electronic switch 52, it may also be necessary for the test circuit 58 to produce signals which interrupt the autonomous performance of the system 10, in order to disable the signals which the system 10 would otherwise send to the terminal 42 which is being tested in the first component 12.

A schematic diagram of a partial interconnection between the electronic component whose internal state is to be determined and an apparatus for determining the internal state is shown in FIG. 5. Some of the channels, for example, channel $52_1$, can be disconnect/force terminals channels, which can be used to disconnect the corresponding terminals of the first and second components 12 and 56 from one another and to impose a signal directed from the control circuit onto the two disconnected terminals. Flip-flop 80 is connected to receive a signal from the control circuit 54 over signal line 82. In response to this signal, and depending upon the present state of the flip-flop 80, a known signal is imposed on node 83 in the circuit $52_1$. The conventional amplifiers 88 and 90 are both also connected to the control circuit 54, which can control them separately. Depending upon the signals imposed upon the amplifiers 88 and 90, the signal imposed on node 83 can be passed through the amplifiers to the respective impedance control circuits 84 and 86. The impedance control circuits 84 and 86 can typically be resistors. These signals will then be respectively imposed on either the terminal 42 on the first component 12, the corresponding terminal on the second component 56, or both of these terminals. The disconnect/force terminals circuit shown in channel $52_1$ is therefore capable of overriding the signals otherwise produced by the first or second components.

While the detailed description above has been expressed in terms of a specific example, those skilled in the art will appreciate that many other circuits could be used to accomplish the purpose of the disclosed inventive apparatus. Accordingly, it can be appreciated that various modifications of the above-described embodiments may be made without departing from the spirit and the scope of the invention. Therefore, the spirit and the scope of the present invention are to be limited only by the following claims.

We claim:

1. Apparatus for determining a sequence of internal states representing a response of a first electronic component in an electronic system comprising one or more electronic components, said first electronic component having one or more first input terminals for communication of signals with said electronic system, the apparatus comprising:
   electronic switch means for controllably switching between a first mode and a second mode, said electronic switch means comprising first and second sets of switchable terminals, said first set of switchable terminals being connected to said first input terminals, said electronic switch means being adapted to permit communication of signals between said first set of switchable terminals and said second set of switchable terminals when said electronic switch means is in said first mode and further being adapted to prevent communication of signals between said first set of switchable terminals and said second set of switchable terminals when said electronic switch means is in said second mode;
   a second electronic component having one or more second input terminals connected to said second set of switchable terminals, said second electronic component operating in parallel with and having a response that is representative of the response of said first electronic component when said electronic switch means is in said first mode, said second electronic component further maintaining its internal state at the time the electronic switch means is switched from said first mode to said second mode; and
   control circuit means for switching said electronic switch means between said first mode and said second mode.

2. The apparatus of claim 1 wherein said control circuit means is a computer operating according to a predetermined program.

3. The apparatus of claim 1 wherein said second electronic component is identical to said first electronic component.

4. The apparatus of claim 1 wherein said electronic switch means further comprises a third set of switchable terminals, said third set of switchable terminals being connected to said second set of switchable terminals when said electronic switch means is in a third mode, whereby signals representing said response of said second component can be communicated between said second signal input terminals and said third set of switchable terminals.

5. The apparatus of claim 4 wherein said control circuit means is connected to said third set of switchable terminals and is further for producing analysis signals on said third set of switchable terminals when said electronic switch means is in said third mode, said analysis signals controlling the response of said second component.

6. The apparatus of claim 5, wherein said control circuit means receives signals from said second component, said apparatus further comprising a digital memory connected to said control circuit means for storing the signals representing said response of said second component.

7. The apparatus of claim 1, said apparatus further comprising signal generation means for generating predetermined signals, said signal generation means being connected to said control circuit, said electronic switch means further comprising a third set of switchable terminals, said third set of switchable terminals being connected to said first and second sets of switchable terminals when said electronic switch means is in a fourth mode, said control circuit means being connected to said third set of switchable terminals, whereby said predetermined signals are imposed on selected members of said first and second sets of switchable terminals when said electronic switch means is in said fourth mode.

8. The apparatus of claim 7 wherein said predetermined signals are functions of said signals from said electronic system.

9. The apparatus of claim 7 wherein said signal generation means comprises a host computer and a digital memory, said host computer generating said predetermined signals, causing said predetermined signals to be stored in said digital memory, and causing said predetermined signals to be imposed on said selected members of said first and second sets of switchable terminals.

10. Apparatus for determining a sequence of internal states representing a response of a first electronic component in an electronic system comprising one or more electronic components, said first electronic component having one or more first input terminals for communication of signals with said electronic system, the apparatus comprising:
    electronic switch means for controllably switching between a first mode and a second mode, said electronic switch means comprising first and second sets of switchable terminals, said first set of switchable terminals being connected to said first input terminals, said electronic switch means being adapted to permit communication of signals between said first set of switchable terminals and said second set of switchable terminals when said electronic switch means is in said first mode and further being adapted to prevent communication of signals between said first set of switchable terminals and said second set of switchable terminals when said electronic switch means is in said second mode;

a second electronic component having one or more second input terminals connected to said second set of switchable terminals, said second electronic component operating concurrently with and having a response that is representative of the response of said first electronic component when said electronic switch means is in said first mode, said second electronic component further maintaining its internal state at the time the electronic switch means is switched from said first mode to said second mode; and control circuit means for switching said electronic switch means between said first mode and said second mode.

11. The apparatus of claim 10 wherein said control circuit means is a computer operating according to a predetermined program.

12. The apparatus of claim 10 wherein said second electronic component is identical to said first electronic component.

13. The apparatus of claim 10 wherein said electronic switch means further comprises a third set of switchable terminals, said third set of switchable terminals being connected to said second set of switchable terminals when said electronic switch means is in a third mode, whereby signals representing said response of said second component can be communicated between said second signal input terminals and said third set of switchable terminals.

14. The apparatus of claim 13 wherein said control circuit means is connected to said third set of switchable terminals and is further for producing analysis signals on said third set of switchable terminals when said electronic switch means is in said third mode, said analysis signals controlling the response of said second component.

15. The apparatus of claim 14, wherein said control circuit means receives signals from said second component, said apparatus further comprising a digital memory connected to said control circuit means for storing the signals representing said response of said second component.

16. The apparatus of claim 10, said apparatus further comprising signal generation means for generating predetermined signals, said signal generation means being connected to said control circuit, said electronic switch means further comprising a third set of switchable terminals, said third set of switchable terminals being connected to said first and second sets of switchable terminals when said electronic switch means is in a fourth mode, said control circuit means being connected to said third set of switchable terminals, whereby said predetermined signals are imposed on selected members of said first and second sets of switchable terminals when said electronic switch means is in said fourth mode.

17. The apparatus of claim 16 wherein said predetermined signals are functions of said signals from said electronic system.

18. The apparatus of claim 16 wherein said signal generation means comprises a host computer and a digital memory, said host computer generating said predetermined signals, causing said predetermined signals to be stored in said digital memory, and causing said predetermined signals to be imposed on said selected members of said first and second sets of switchable terminals.

19. Apparatus for determining a sequence of internal states representing a response of a first electronic component in an electronic system comprising one or more electronic components, said first electronic component having one or more first input terminals for communication of signals with said electronic system, the apparatus comprising:

electronic switch means for controllably switching between a first mode and a second mode, said electronic switch means comprising first and second sets of switchable terminals, said first set of switchable terminals being connected to said first input terminals, said electronic switch means being adapted to permit communication of signals between said first set of switchable terminals and said second set of switchable terminals when said electronic switch means is in said first mode and further being adapted to prevent communication of signals between said first set of switchable terminals and said second set of switchable terminals when said electronic switch means is in said second mode;

a second electronic component having one or more second input terminals connected to said second set of switchable terminals, said second electronic component operating concurrently with and having a response that is representative of the response of said first electronic component when said electronic switch means is in said first mode, said second electronic component further maintaining its internal state at the time the electronic switch means is switched from said first mode to said second mode; and control circuit means for switching said electronic switch means between said first mode and said second mode.

20. The apparatus of claim 19 wherein said electronic switch means further comprises a third set of switchable terminals, said third set of switchable terminals being connected to said second set of switchable terminals when said electronic switch means is in a third mode, whereby signals representing said response of said second component can be communicated between said second signal input terminals and said third set of switchable terminals.

21. The apparatus of claim 20 wherein said control circuit means is connected to said third set of switchable terminals and is further for producing analysis signals on said third set of switchable terminals when said electronic switch means is in said third mode, said analysis signals controlling the response of said second component.

22. Apparatus for determining an internal state of a first electronic component at a time known relative to the time of occurrence of a predetermined event, said first electronic component forming part of an electronic system comprising one or more electronic components and having one or more signal input terminals for communication of signals with said electronic system, the apparatus comprising:

electronic switch means for controllably switching between a first mode and a second mode, said electronic switch means comprising first and second sets of switchable terminals, said first set of switchable terminals being connected to said first input terminals, said electronic switch means being adapted to permit communication of signals between said first set of switchable terminals and said second set of switchable terminals when said electronic switch means is in said first mode and further being adapted to prevent communication of signals between said first set of switchable terminals and said second set of switchable terminals from said signals when said electronic switch means is in said second mode;

a second electronic component having internal states and one or more second input terminals connected to said second set of switchable terminals, said second electronic component changing states in parallel with said first electronic component when said electronic switch means is in said first mode, said internal states of said second component being thereby representative of said states of said first component, and said second component maintaining its internal state at the time the electronic switch means is switched from said first mode to said second mode; and control circuit means for switching said electronic switch means to switch from said first mode to said second mode at the time of occurrence of said predetermined event, thereby causing the current state of said second electronic component to be representative of the current state of the first electronic component at the time of occurrence of said predetermined event.

23. The apparatus of claim 22 wherein said control circuit means is further for receiving said input signals and controlling said electronic switch means to switch to said second mode when said input signals include a predetermined signal.

24. The apparatus of claim 22 wherein said electronic switch means further comprises a third set of switchable terminals, said third set of switchable terminals being connected to said second set of switchable terminals when said electronic switch means is in a third mode, whereby signals representing said internal state of said second component can be transmitted from said second signal input terminals to said third set of switchable terminals.

25. The apparatus of claim 22, further comprising a digital memory connected to said control circuit means for storing the signals representing said internal state of said second component.

26. The apparatus of claim 22 wherein said control circuit means is a computer operating according to a predetermined program.

27. The apparatus of claim 22 wherein said second electronic component is identical to said first electronic component.

28. Apparatus for determining an internal state of a first electronic component at the time of occurrence of a predetermined event, said first electronic component forming part of an electronic system comprising one or more electronic components and having one or more first input terminals for communication of signals with said electronic system, the apparatus comprising:

electronic switch means for controllably switching between a first mode and a second mode, said electronic switch means comprising first and second sets of switchable terminals, said first set of switchable terminals being connected to said first input terminals, said electronic switch means being adapted to permit communication of signals between said first set of switchable terminals and said second set of switchable terminals when said electronic switch means is in said first mode and further being adapted to prevent communication of signals between said first set of switchable terminals and said second set of switchable terminals from said signals when said electronic switch means is in said second mode;

a second electronic component having internal states and one or more second input terminals connected to said second set of switchable terminals, said second electronic component changing states concurrently with said first electronic component when said electronic switch means is in said first mode, said internal states of said second component being thereby representative of said states of said first component, and said second component maintaining its internal state at the time the electronic switch means is switched from said first mode to said second mode; and control circuit means for switching said electronic switch means to switch from said first mode to said second mode at the time of occurrence of said predetermined event, thereby causing the current state of said second electronic component to be representative of the current state of the first electronic component at the time of occurrence of said predetermined event.

29. The apparatus of claim 28 wherein said control circuit means is further for receiving said input signals and controlling said electronic switch means to switch to said second mode when said input signals include a predetermined signal.

30. The apparatus of claim 28 wherein said electronic switch means further comprises a third set of switchable terminals, said third set of switchable terminals being connected to said second set of switchable terminals when said electronic switch means is in a third mode, whereby signals representing said internal state of said second component can be transmitted from said second signal input terminals to said third set of switchable terminals.

31. The apparatus of claim 28, further comprising a digital memory connected to said control circuit means for storing the signals representing said internal state of said second component.

32. The apparatus of claim 28 wherein said control circuit means is a computer operating according to a predetermined program.

33. The apparatus of claim 28 wherein said second electronic component is identical to said first electronic component.

34. Apparatus for determining an internal state of a first electronic component at a time known relative to the time of occurrence of a predetermined event, said first electronic component forming part of an electronic system comprising one or more electronic components and having one or more first input terminals for communication of signals with said electronic system, the apparatus comprising:

electronic switch means for controllably switching among a first mode, a second mode, and a third mode, said electronic switch means comprising first, second, and third sets of switchable terminals, said first switchable terminals being connected to said first input terminals, said electronic switch means being adapted to permit communication of said signals to said second set of switchable terminals when said electronic switch means is in said first mode and to disconnect said first set of switchable terminals and said second set of switchable terminals when said electronic switch means is in said second mode, said third set of switchable terminals being connected to said second set of switchable terminals when said electronic switch means is in said third mode;

a second electronic component having internal states and one or more second input terminals connected to said second set of switchable terminals, said second electronic component changing states in parallel with said first electronic component when said electronic switch means is in said first mode, said internal states of said second component being thereby representative of said states of said first component, said second component maintaining its internal state at the time when the predetermined event caused the electronic switch means to switch from said first mode to said second mode, signals representing said internal state of said second component being transmitted from said second signal input terminals to said third set of switchable terminals when said electronic switch means is in said second mode;

control circuit means for controlling said electronic switch means to switch from said first mode to said second mode at the time of occurrence of said predetermined event, thereby causing the current state of said second electronic component to be representative of the current state of the first electronic component at the time of occurrence of said predetermined event, said control circuit means further receiving said signal representing said internal state of said second component when said electronic switch means is in said second mode; and a host computer operating according to a predetermined simulation program and connected to said control circuit for receiving said signals representing said state of said second component and using said signals in said simulation program.

35. The apparatus of claim 34 wherein said first and second electronic components comprise digital memories and said host computer further produces signals representing initial state information, said signals representing initial state information being loaded into said digital memories of said first and second electronic components.

36. Apparatus for determining an internal state of a first electronic component at the time of occurrence of a predetermined event, said first electronic component forming part of an electronic system comprising one or more electronic components and having one or more first input terminals for communication of signals with said electronic system, the apparatus comprising:

electronic switch means for controllably switching among a first mode, a second mode, and a third mode, said electronic switch means comprising first, second, and third sets of switchable terminals, said first switchable terminals being connected to said first input terminals, said electronic switch means being adapted to permit communication of said signals to said second set of switchable terminals when said electronic switch means is in said first mode and to disconnect said first set of switchable terminals and said second set of switchable terminals when said electronic switch means is in said second mode, said third set of switchable terminals being connected to said second set of switchable terminals when said electronic switch means is in said third mode;

a second electronic component having internal states and one or more second input terminals connected to said second set of switchable terminals, said second electronic component changing states concurrently with said first electronic component when said electronic switch means is in said first mode, said internal states of said second component being thereby representative of said states of said first component, said second component maintaining its internal state at the time when the predetermined event caused the electronic switch means to switch from said first mode to said second mode, signals representing said internal state of said second component being transmitted from said second signal input terminals to said third set of switchable terminals when said electronic switch means is in said second mode;

control circuit means for controlling said electronic switch means to switch from said first mode to said second mode at the time of occurrence of said predetermined event, thereby causing the current state of said second electronic component to be representative of the current state of the first electronic component at the time of occurrence of said predetermined event, said control circuit means further receiving said signals representing said internal state of said second component when said electronic switch means is in said second mode; and a host computer operating according to a predetermined simulation program and connected to said control circuit for receiving said signals representing said state of said second component and using said signals in said simulation program.

37. The apparatus of claim 36 wherein said first and second electronic components comprise digital memories and said host computer further produces signals representing initial state information, said signals representing initial state information being loaded into said digital memories of said first and second electronic components.

38. A method for determining a response of a first electronic component forming part of an electronic system comprising one or more electronic components, said first electronic component having one or more signal input terminals for receiving signals from the electronic system, the method comprising the steps of:

(a) connecting electronic switch means to the electronic system to controllably switch between a first mode and a second mode, said electronic switch means transmitting said signals from a first set of switchable terminals to a second set of switchable terminals when said electronic switch means is in said first mode and isolating said second set of switchable terminals from said signals when said electronic switch means is in said second mode;

(b) connecting one or more signal input terminals of a second electronic component to said second set of switchable terminals of said electronic switch means;

(c) causing said electronic switch means to enter said first mode;

(d) operating said first electronic component and said second electronic component in parallel;

(e) causing said electronic switch means to enter said second mode at which time said second component is in a first internal state; and (f) reading said signals representing said first internal state of said second component from said second component to said electronic switch means.

39. The method of claim 38, further comprising the steps of:
(g) causing the second component to change to a second internal state from said first internal state; and
(h) reading said signals representing said second internal state of said second component from said second component to said electronic switch means.

40. The method of claim 38, further comprising the step of causing said first and second electronic components to be in the same initial internal states.

41. The method of claim 38, further comprising the steps of (g) connecting a control circuit to a third set of switchable terminals in said electronic switch means, (h) connecting a digital memory to said control circuit and (i) reading said signals representing said first internal state of said second component from said electronic switch means into said digital memory.

42. The method of claim 41, further comprising the steps of producing analysis signals when said switch is in said second mode, and applying said analysis signals to said second component to determine the state of said second component.

43. A method for determining an internal state of a first electronic component at the time of occurrence of a predetermined event, said first electronic component forming part of an electronic system comprising one or more electronic components and having one or more signal input terminals for receiving signals from the electronic system, the method comprising the steps of:
(a) connecting electronic switch means to the electronic system to receive the signals from the electronic system, the electronic switch means being controllably switchable between a first mode and a second mode, and being adapted to transmit said signals from a first set of switchable terminals to a second set of switchable terminals when said electronic switch means is in said first mode and to isolate said second set of switchable terminals from said signals when said electronic switch means is in said second mode;
(b) connecting one or more second signal input terminals of a second electronic component to said second set of switchable terminals of said electronic switch means, said second electronic component operating in parallel with said first electronic component when said electronic switch means is in said first mode; and
(c) controlling said electronic switch means to switch from said first mode to said second mode at the time of occurrence of said predetermined event, thereby causing said second electronic component to be in the same state as the first electronic component at the time of occurrence of said predetermined event.

44. A method for determining a response of a first electronic component forming part of an electronic system comprising one or more electronic components, said first electronic component having one or more signal input terminals for receiving signals from the electronic system, the method comprising the steps of:
(a) connecting electronic switch means to the electronic system to controllably switch between a first mode and a second mode, said electronic switch means transmitting said signals from a first set of switchable terminals to a second set of switchable terminals when said electronic switch means is in said first mode and isolating said second set of switchable terminals from said signals when said electronic switch means is in said second mode;
(b) connecting one or more signal input terminals of a second electronic component to said second set of switchable terminals of said electronic switch means;
(c) causing said electronic switch means to enter said first mode;
(d) operating said first electronic component and said second electronic component concurrently;
(e) causing said electronic switch means to enter said second mode at which time said second component is in a first internal state; and
(f) reading said signals representing said first internal state of said second component from said second component to said electronic switch means.

45. The method of claim 44, further comprising the steps of:
(g) causing the second component to change to a second internal state from said first internal state; and
(h) reading said signals representing said second internal state of said second component from said second component to said electronic switch means.

46. The method of claim 44, further comprising the step of causing said first and second electronic components to be in the same initial internal states.

47. The method of claim 44, further comprising the steps of (g) connecting a control circuit to a third set of switchable terminals in said electronic switch means, (h) connecting a digital memory to said control circuit and (i) reading said signals representing said internal state of said second component from said electronic switch means into said digital memory.

48. A method for determining an internal state of a first electronic component at the time of occurrence of a predetermined event, said first electronic component forming part of an electronic system comprising one or more electronic components and having one or more signal input terminals for receiving signals from the electronic system, the method comprising the steps of:
(a) connecting electronic switch means to the electronic system to receive the signals from the electronic system, the electronic switch means being controllably switchable between a first mode and a second mode, and being adapted to transmit said signals from a first set of switchable terminals to a second set of switchable terminals when said electronic switch means is in said first mode and to isolate said second set of switchable terminals from said signal when said electronic switch means is in said second mode;
(b) connecting one or more second signal input terminals of a second electronic component to said second set of switchable terminals of said electronic switch means, said second electronic component operating concurrently with said first electronic component when said electronic switch means is in said first mode; and
(c) controlling said electronic switch means to switch from said first mode to said second mode at the time of occurrence of said predetermined event, thereby causing said second electronic component to be in the same state as the first electronic component at the time of occurrence of said predetermined event.

49. The method of claim 48, further comprising the steps of producing analysis signals when said switch is in said second mode, and applying said analysis signals to said second component to determine the state of said second component.

* * * * *